(12) United States Patent
Kuit et al.

(10) Patent No.: US 7,394,525 B2
(45) Date of Patent: Jul. 1, 2008

(54) EXCHANGEABLE OBJECT HANDLING APPARATUS, LITHOGRAPHIC APPARATUS INCLUDING SUCH EXCHANGEABLE OBJECT HANDLING APPARATUS, AND DEVICE MANUFACTURING METHOD

(75) Inventors: Jan Jaap Kuit, Veldhoven (NL); Jan Frederik Hoogkamp, Breda (NL); Hubert Marie Segers, 'S-Hertogenbosch (NL); Raimond Visser, Best (NL); Johannes Maquine, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 230 days.

(21) Appl. No.: 10/969,244

(22) Filed: Oct. 21, 2004

(65) Prior Publication Data

US 2006/0087636 A1     Apr. 27, 2006

(51) Int. Cl.
*G03B 27/58*     (2006.01)
*G03B 27/42*     (2006.01)
(52) U.S. Cl. .......................................... 355/72; 355/53
(58) Field of Classification Search ................... 355/72, 355/53, 77, 75; 700/245; 414/935
See application file for complete search history.

(56) References Cited

U.S. PATENT DOCUMENTS

2004/0019408 A1 *   1/2004   del Puerto et al. ........... 700/245
2004/0041148 A1 *   3/2004   Shulman et al. ............... 257/48

* cited by examiner

*Primary Examiner*—Peter B Kim
(74) *Attorney, Agent, or Firm*—Pillsbury Winthrop Shaw Pittman LLP

(57) ABSTRACT

The present invention provides a lithographic apparatus including an illumination system configured to condition a radiation beam; a patterning device support constructed to support a patterning device, the patterning device placed on the patterning device support being capable of imparting the radiation beam with a pattern in its cross-section to form a patterned radiation beam; a substrate table constructed to hold a substrate; a projection system configured to project the patterned radiation beam onto a target portion of the substrate, and a patterning device handling apparatus, including a single robot for exchanging a patterning device with the patterning device support and a loading station, wherein the robot includes a first holding device configured to hold a patterning device in a first holding position and a second holding device configured to hold a patterning device in a second holding position. Such single robot makes a rapid and accurate exchange of patterning devices possible.

35 Claims, 4 Drawing Sheets

EXCHANGEABLE OBJECT HANDLING APPARATUS, LITHOGRAPHIC APPARATUS INCLUDING SUCH EXCHANGEABLE OBJECT HANDLING APPARATUS, AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the conventional lithographic apparatus, a patterning device handling apparatus is provided to exchange a patterning device between the patterning device support on which the patterning device is positioned during the transfer of a pattern on a substrate, and a stationary loading station wherein one or more patterning devices can be placed. The patterning devices are exchanged between the loading station and the patterning device station to subsequently transfer the different patterns of the patterning devices on the substrates which are placed on a substrate support.

Production capacity of a lithographic apparatus is, in part, affected by the exchange time needed to take away a patterning device which is located on the patterning device support and place another patterning device on the patterning device support. During the time needed for this exchange, no pattern can be transferred on a substrate. In order to increase the capacity of the lithographic apparatus it is desirable to decrease this exchange time.

In order to keep the exchange time small, the patterning device handling apparatus of a conventional lithographic apparatus includes a turret and a robot. The turret can hold at the same time two patterning devices in two different holding positions, whereby the turret can be rotated around its vertical axis so that one of the two holding positions can be turned to a position wherein the turret can exchange a patterning device with the patterning device support. In another position, usually when the turret is rotated over 180 degrees, a patterning device in the other of the two holding position can be exchanged with the patterning device support.

The patterning device handling apparatus further includes a robot to exchange a patterning device between a loading station and the turret, so that a patterning device held by the turret can be exchanged for another one.

When a first patterning device held in the patterning device support is to be exchanged by a second patterning device which is placed in a loading station, the second patterning device can, during the transfer of the pattern of the first patterning device on a substrate, be placed by the robot in one of the holding positions of the turret. When the transfer is finished, the first patterning device is taken by the turret out of the patterning device support. After that, the turret is rotated and the second patterning device can then be placed on the patterning device support. Subsequently the pattern can be transferred on a substrate. During this pattern transfer the robot can take the second patterning device out of the turret and place it in a loading station.

However, the turret is a relative expensive part of the lithographic apparatus, also due to the required position of the turret close to the patterning device support.

SUMMARY

It is desirable to have a lithographic apparatus including an improved patterning device handling apparatus, which provides a better optimum between costs and required space than a conventional patterning device handling apparatus.

According to an embodiment of the invention, there is provided a lithographic apparatus including an illumination system configured to condition a radiation beam; a patterning device support constructed to support a patterning device, the patterning device placed on the patterning device support being capable of imparting the radiation beam with a pattern in its cross-section to form a patterned radiation beam; a substrate table constructed to hold a substrate; a projection system configured to project the patterned radiation beam onto a target portion of the substrate, and an exchangeable object handling apparatus, including a single robot for exchanging an exchangeable object with a support and a loading station, wherein the robot includes a first holding device configured to hold an exchangeable object in a first holding position and a second holding device configured to hold an exchangeable object in a second holding position.

According to another embodiment of the invention, there is provided a device manufacturing method including, in an operational phase, providing a beam of radiation using an illumination system, using a patterning device placed on a patterning device support to impart the beam of radiation with a pattern in its cross-section, and projecting the patterned beam of radiation onto a substrate, and, in an exchanging phase, exchanging an exchangeable object between a support and a loading station using a single robot, the robot including a first holding device configured to hold an exchangeable object in a first holding position and a second holding device configured to hold an exchangeable object in a second holding position.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
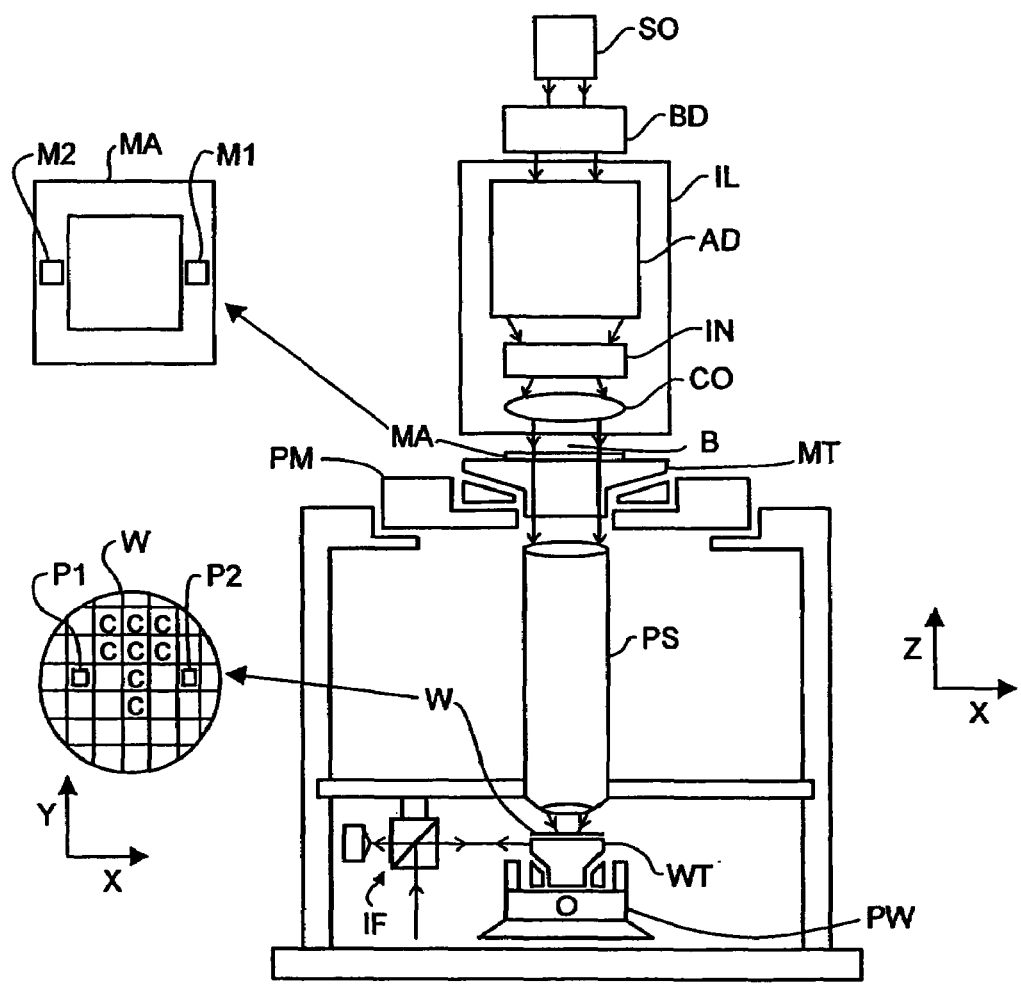
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or other types of suitable type of radiation) and a support structure (e.g. a mask table) MT constructed to support a patterning device (e.g. a mask) MA and connected to a first positioner PM configured to accurately position the patterning device in accordance with certain parameters. The apparatus further includes a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having transversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path on the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
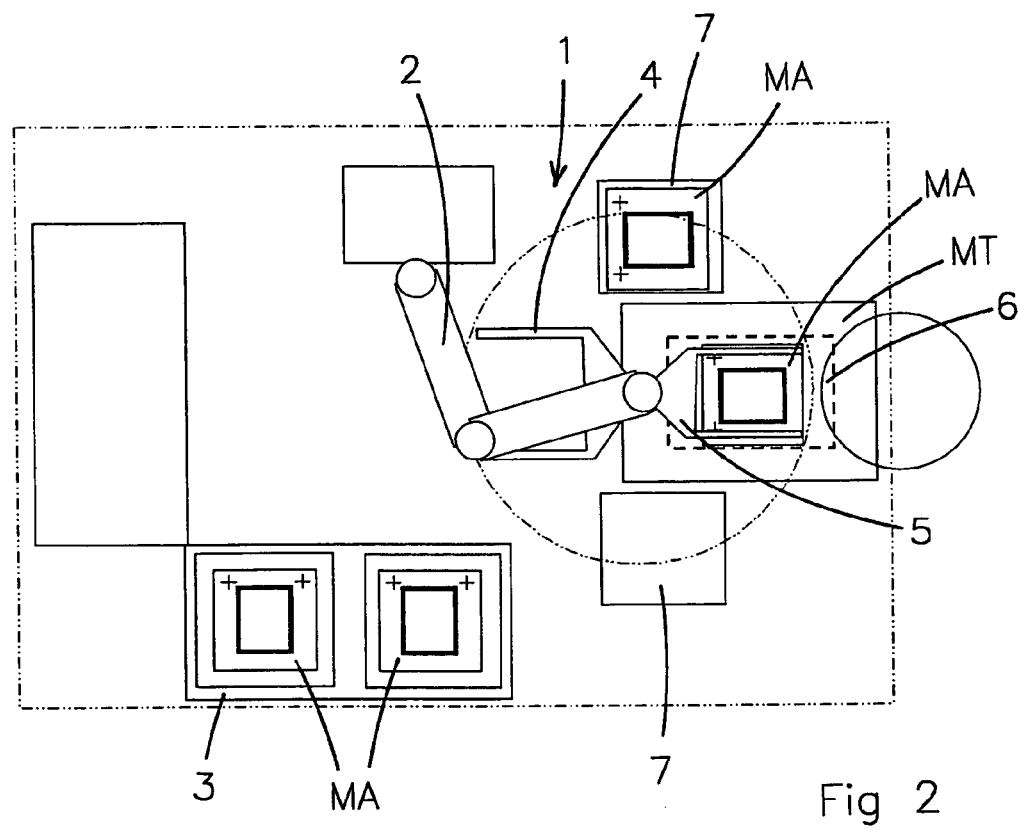
FIG. 2 depicts a top view of a patterning device handling apparatus according to an embodiment of the invention.

FIG. 2 shows a first embodiment of a patterning device handling apparatus which in general is indicated with the reference numeral 1. The patterning device handling apparatus 1 includes a single robot 2 configured to exchange a patterning device MA between the patterning device support MT and a loading station 3. The loading station 3 is a stationary station in which one or more patterning devices are placed before they are transferred by the robot 2 to the patterning device support MT. The robot 2 may also be suitable for exchanging a patterning device MA with any other patterning device station such as an inspection station, a buffer station or a cleaning station. When a patterning device MA is directly transferred from such other station to the patterning device support MT, this other station is also regarded to be a loading station 3 in the context of his application. The robot 2 is a multi-axis robot which in an efficient way can move the patterning devices it holds to the patterning device supports and the respective patterning device stations. A robot is defined as a manipulator including two or more arms, the two or more arms being movably connected to each other, for example rotatably, whereby at least one end of the robot is designed to manipulate an object with a certain space.

The robot 2 includes a first holding device 4 configured to hold a patterning device in a first holding position and a second holding device 5 configured to hold a patterning device in a second holding position. The provision of two holding devices makes a rapid exchange of a patterning device MA on the patterning device support MT possible. The single robot 2 requires less space near to the mask table MT than a robot-turret combination known from prior art. Further, a single robot is less expensive. Also, since the patterning device MA is not taken over by two moving apparatuses of the patterning device handling apparatus 1 (such as in the robot-turret combination) a more accurate transfer of the patterning device MA may be obtained.

Figure 3:
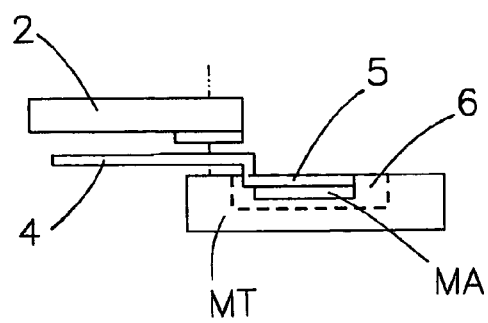
FIG. 3 depicts a side view of the robot as depicted in FIG. 2

The first and second holding devices 4, 5 can be any suitable type of devices configured to hold a patterning device MA such as mechanical, vacuum, electromagnetic and electrostatic gripping devices. In FIG. 3, a side view of a part of the robot 2 is shown including the first holding device 4 and the second holding device 5.

The patterning device support MT often includes in its top side a recessed space 6 known as "pod hole" (see FIG. 3) wherein the patterning device MA is supported. As a consequence of this space, it is desirable to provide special adapted devices to place a patterning device MA on or take a patterning device from the patterning device support MT. A known solution is to use so-called r-pins which are mounted in the patterning device support MT and which can lift a patterning device MA above the recessed space so that a gripper of the patterning device handling apparatus can grip under the patterning device MA. However, the use of such r-pins may have a number of disadvantages. First of all, the r-pins may reduce take-over accuracy and may increase take-over time. Further, the r-pins system may be sensitive for contamination for the backside of the patterning device MA and adds extra weight to the patterning device support MT as the system is integrated in the patterning device support MT. Also, the clamping area may be reduced due to the presence of the r-pins. As an alternative solution, it is possible to hold a patterning device at its top or sides to take it out or place it on the patterning device support MT. However, such holding device is usually not compatible with the other stations, in particular the loading station 3.

In the robot 2 of FIG. 2, the first holding device 4 is designed to be compatible with the loading station 3 and the second holding device 5 is designed to be compatible with the patterning device support MT so that the robot can exchange a patterning device MA with the loading station 3 and the patterning device support MT. This compatibility may be obtained, for example, by the first holding device 4 holding a patterning device MA at its bottom side, while the second holding device 5 holds a patterning device MA at its sides or top.

In the robot 2 of FIG. 2, the first holding device 4 is associated with the first holding position and the second holding device 5 is associated with the second holding position. During the exchange of a patterning device MA from the loading station 3 to the patterning device support MT the patterning device MA should be transferred from the first holding position to the second holding position in order to make a proper exchange possible. For this reason the device handling apparatus 1 includes a transferring device configured to transfer the patterning device MA from the first holding device to the second holding device. In FIG. 2, the transferring device includes two stationary intermediate stations 7 on which the patterning device MA which is exchanged can temporarily be placed. The transferring device may also be arranged on the robot 2 itself, such as for example a movable arm with a gripper which can bring a patterning device from one holding position to the other holding position.

With the patterning device handling apparatus 1 as shown in FIG. 2, a first patterning device MA placed on the patterning device support MT can be replaced by a second patterning device MA according to the following method.

During the operational phase in which a substrate is illuminated with a pattern of the first patterning device MA, the robot 2 takes the second patterning device MA with the first holding device out of the loading station 3 while holding it in the first holding position. Subsequently, the robot places the second patterning device MA on one of the two intermediate stations. When the illumination of the substrate is finished the robot takes, with the second holding device, the first patterning device MA from the patterning device support MT (this situation is shown in FIG. 2) and places the first patterning device MA on the other of the two intermediate stations. As a next step, the second patterning device MA is taken by the second holding device and placed on the patterning device support MT. Thereafter, the illumination of a substrate with the pattern of the second patterning device MA may be started in a further operational phase. Before or during this illumination, the robot may take, with the first holding device, the first patterning device MA and place it in a loading station 3. The exchanging phase may thus partially overlap with the operational phase. The above-described method gives an efficient method for the quick exchange of a patterning device MA, whereby an accurate take-over of the patterning device MA is provided.

Figure 4:
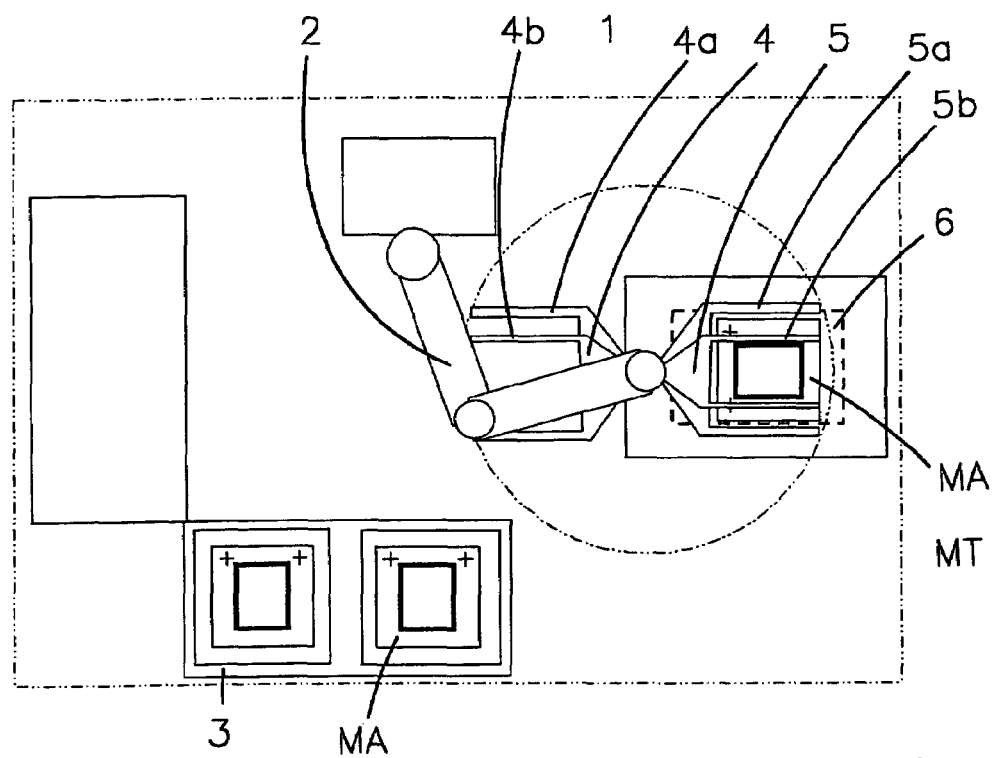
FIG. 4 depicts a robot according to an embodiment of the invention.

In FIG. 4 an alternative embodiment of the patterning device handling apparatus 1 of FIGS. 2 and 3 is shown, whereby the same or equivalent parts of the patterning device handling apparatus are indicated with the same reference numerals. In this alternative embodiment, each of the first and second holding devices 4, 5 of the robot 2 includes a first gripping device 4a, 5a being compatible with the loading station 3 and a second gripping device 4b, 5b being compatible with the patterning device support MT. In this way, a patterning device MA can be exchanged between the loading station 3 and the patterning device support MT while staying in the same holding position. During this exchange, the patterning device MA is taken over from the first gripping device 4a, 5a with which the patterning device MA is taken out of the loading station 3, by the second gripping device 4b, 5b which is compatible with the patterning device support MT. For example, the first gripping device 4a, 5a may hold a patterning device MA at its bottom, while the second gripping device 4b, 5b holds the patterning device MA at its top.

It will be clear that during the exchange of a patterning device MA in the reverse from the patterning device support MT to the loading station 3, the patterning device MA may be taken over from the second gripping device 4b, 5b by the first gripping device 4a, 5a while it stays in the same holding position. In this alternative embodiment of FIG. 4, it may be required to make the first gripping device 4a, 5a and/or second gripping device 4b, 5b movable with respect to the holding position to make an exchange possible. For example, when the first gripping device 4a, 5a holds a patterning device MA at the bottom and the second gripping device 4b, 5b holds the patterning device MA at the top, the first gripping device 4a, 5a could, if not moved out the way, obstruct the placement of the patterning device MA on the patterning device support MT. Moving the first gripping device 4a, 5a from the gripping position wherein it can hold a patterning device MA to a non-gripping position where it does not interfere with the patterning device support MT makes a correct placement of the patterning device MA on the patterning device support MT possible. Accordingly it may be desirable, when a patterning device MA which is held or is to be held by the first gripping device 4a, 5a when exchanging the patterning device MA with the loading station 3, to move the second gripping device 4b, 5b from a gripping position to a non-gripping position so that the second gripping device 4b, 5b does not obstruct a proper exchange between the robot 2 and the loading station 3.

In this alternative embodiment of FIG. 4, no transferring device such as, for example, the intermediate stations 7 of FIG. 2 is needed.

When two holding positions are provided on an end-effector, whereby each of the holding positions is associated with at least one holding device, the second holding device may interfere with the patterning device support MT when a patterning device MA in the first holding position is placed on the patterning device support MT or taken from the patterning device support MT. Such interference would make the exchange between the first holding position and the patterning device support MT impossible.

Figure 5:
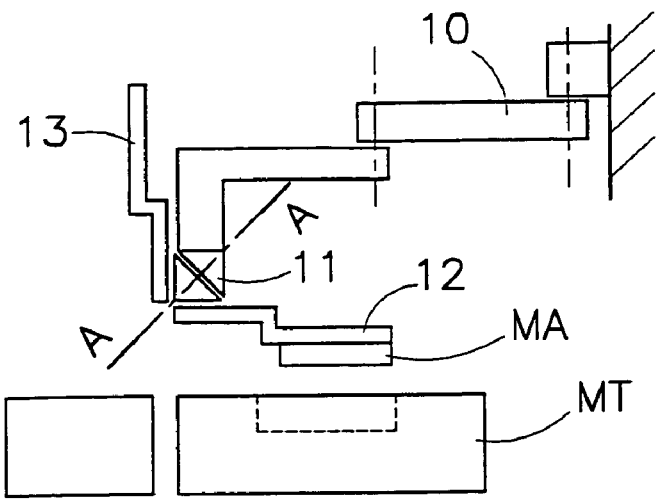
FIG. 5 depicts a robot according to an embodiment of the invention.
Figure 6:
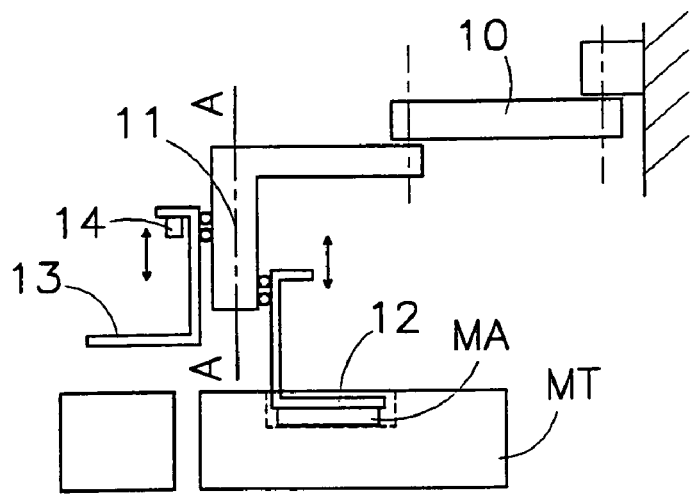
FIG. 6 depicts a robot according to an embodiment of the invention.
Figure 7:
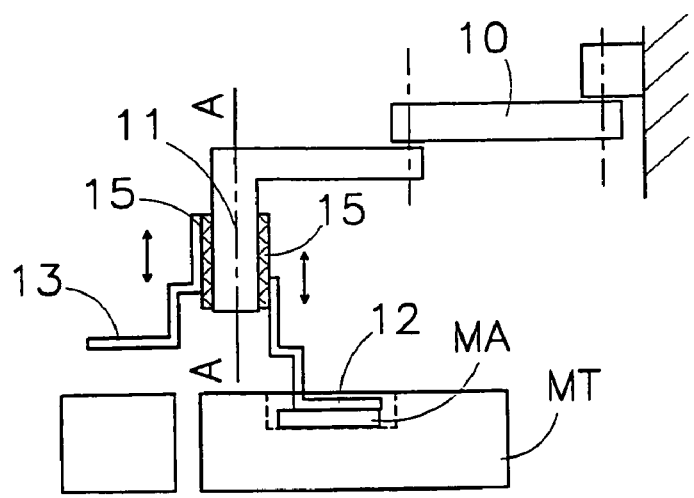
FIG. 7 depicts a robot according to an embodiment of the invention.

In FIGS. 5, 6 and 7, three embodiments of robots are shown which are designed to bring, when one of the first and second holding devices is brought to the patterning device station to place a patterning device MA on or take a patterning device MA from the patterning device support MT, the other of the first and the second holding devices in a position wherein the other holding device does not interfere with the patterning device support MT. In this way, a solution is provided for the described problem.

The support region of the patterning device support is defined as the region in which the bottom side of a patterning device is lying when it is supported on the patterning device support. In an embodiment of the invention, the support region may be a support plane. This support plane may be an imaginary plane extending through different support points or the supporting surface of the patterning device support.

In the FIGS. 5, 6 and 7 the support region is a support plane that is horizontal. Therefore, the positions and directions of the first and second holding device with respect to each other and the patterning device support have been described hereinafter with respect to this horizontal plane (e.g. above, under, vertical, horizontal, higher, lower). It is in other embodiments of a lithographic apparatus possible that the support plane is not horizontal. In such case, a position above the patterning device support should be read as a position spaced from the support plane or from a plane parallel to the support plane. It is also possible that the patterning device support holds a patterning device at the underside. In such embodiment the vertical directions should be reversed (above should be read as under).

The first and the second holding device may be the same or may be of a different type or shape, for example, depending on the compatibility with the loading station 3 and the patterning device support MT as discussed above.

In FIG. 5, a robot 10 is shown having an end-effector 11 with a first holding device 12 and a second holding device 13. The end-effector 11 is rotatable around an axis of rotation A-A and may be a part on which both holding devices 12, 13 are arranged. It is also possible to provide a single end-effector 11 part for each of the holding devices 12, 13. The first and the second holding devices 12, 13 are arranged diametrically opposed to each other with respect to the axis of rotation of the end-effector 11.

In the embodiment of the invention shown in FIG. 5, the axis of rotation A-A of the end-effector is arranged at an angle of about 45 degrees with respect to the horizontal. As a result, the first holding device 12 and the second holding device 13 will during rotation of the end-effector 11 displace horizontally and vertically. Since the first holding device 12 and the second holding device 13 are arranged at diametrically opposed positions, the first holding device will be in the highest position when the second holding device is in its lowest position. As a result, the second holding device 13 is positioned in this highest position when the first holding device 12 is brought in its lowest position to the patterning device support MT to place a patterning device MA on or take a patterning device MA from the patterning device support MT, as shown in FIG. 5. Due to this higher position the second holding device does not interfere with the patterning device support MT.

In order to obtain the described effect the angle of the axis of rotation A-A is in general less than 90 degrees with respect to the horizontal, or from about 25 to 65 degrees with respect to the horizontal in an embodiment of the invention, or from about 40 to 50 degrees with respect to the horizontal in another embodiment of the invention.

In the embodiment of the invention shown in FIG. 6, the robot 10 includes an end-effector 11 on which a first holding device 12 and a second holding device 13 are arranged. The end-effector 11 may rotatably be arranged on the arm of the robot or the first holding device 12 and the second holding device 13 may rotatably be connected to the central part of the end-effector 11. The corresponding axis of rotation is indicated in FIG. 6 with A-A.

The first holding device 12 and the second holding device 13 are independently movable in a substantially vertical direction with respect to the other parts of the robot 10. The holding device 12 and 13 are normally positioned in the lowest position which is the load/unload position, i.e. the position in which the respective holding device is positioned when that holding device exchanges a patterning device with the patterning device support MT.

The device handling apparatus includes a stop 14 which at a certain point, when one of the holding device 12, 13 is moved to the patterning device support MT in a downward direction, stops the downward movement of the other of the holding device. In this way, the other of the holding device (in FIG. 6, holding device 13) is brought to an inactive position wherein it is held due to the presence of the stop on a higher level than the one of the holding device 12 brought to the patterning device support. As a consequence, the other holding device 13 does not interfere with the patterning device support MT or any other element at the same height as the patterning device support MT, such as actuators for the patterning device support MT and sensors to measure the position of the patterning device support MT. Also the disturbance of the signals of these sensors may be avoided.

The stop 14 can be designed, for example, as a stationary mechanical element which is mounted at one side of the end-effector 11. The holding devices 12, 13 rotated to this side are stopped when the robot 10 is brought past a certain point in a downward direction. As an alternative, the stop 14 can also be designed as two independently actuable mechanical or electromagnetic elements which can be actuated to project to form a stop for one of the first and second holding means 12, 13.

A robot 10 in accordance with another embodiment of the invention is shown in FIG. 7. The robot 10 includes an end-effector which is rotatable around a vertical axis of rotation A-A. The end-effector 11 includes a first holding device 12 and a second holding device 13 that are configured to hold a patterning device in a first holding position and a second holding position, respectively. The holding devices 12, 13 are independently movable in a substantially vertical direction with respect to the central part of the end-effector 11 between a load/unload position and an inactive position as described with respect to the embodiment in FIG. 6. The end-effector 11 includes for each of the first and the second holding devices 12, 13 an actuator 15 that can move the respective holding devices 12, 13 to the desired position, i.e. the load/unload position or the inactive position. The actuators 15 can be of any suitable type, such as, for example, electromotors, which can be light to keep the weight of the end-effector 11 low. In principle, it would also be possible to use one actuator that moves one of the holding devices 12, 13 to the inactive position when the other of the holding devices 12, 13 is moved to the load/unload position.

When a patterning device in the first holding device 12 is brought towards the patterning device support MT to place it on the patterning device support, the actuator 14 of the first holding device 12 brings this first holding device in the load/unload position and the actuator of the second holding device 13 brings this holding device 13 in the inactive position. In this way, the second holding device 13 does not interfere with the patterning device support MT or any other element at the height of the patterning support device MT making an exchange of the patterning device MA possible.

In the above description of the appended Figures a patterning device handling apparatus has been described. Such apparatus could also be used for the exchange of substrates between the substrate support (wafer table) and a substrate loading station, or any other exchangeable object in a lithographic apparatus. Such substrate handling device or exchangeable object handling device which can have all features as described and claimed in this application with respect to the patterning device handling apparatus, is deemed to fall within the scope of the present application.

In the description of the patterning device handling apparatus, a robot with two holding devices is described. However, it is also possible that such robot includes three or more holding devices configured to hold each an exchangeable object in a holding position. Each of these holding devices may be compatible with one or more of the exchangeable object stations and the exchangeable object support. Such robot with three or more holding devices is deemed to fall within the scope of the application and the appended claims.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various type of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a patterning device support constructed to support a patterning device, the patterning device placed on the patterning device support being capable of imparting the radiation beam with a pattern in its cross-section to form a patterned radiation beam;
   a substrate table constructed to hold a substrate;
   a projection system configured to project the patterned radiation beam onto a target portion of the substrate, and
   an exchangeable object handling apparatus comprising a single robot configured to exchange an exchangeable object with a support and a loading station, wherein said robot comprises a first holding device configured to hold an exchangeable object in a first holding position and a second holding device configured to hold an exchangeable object in a second holding position, wherein said first holding device, or said second holding device, or both said first holding device and said second holding device, has two gripping devices, each of said gripping devices configured to hold an exchangeable object; wherein a first of the two gripping devices is compatible with said loading device and a second of the two gripping devices is compatible with said support.

2. The lithographic apparatus of claim 1, wherein said first holding device is compatible with said loading station and said second holding device is compatible with said support.

3. The lithographic apparatus of claim 2, wherein said exchangeable object handling apparatus comprises a transferring device configured to transfer an exchangeable object from said first holding device to said second holding device or vice versa.

4. The lithographic apparatus as claimed in claim 3, wherein said transferring device comprises one or more stationary intermediate stations that are configured to temporarily store said exchangeable object.

5. The lithographic apparatus of claim 3, wherein said robot further comprises one or more holding devices, each of said one or more holding devices being compatible with one or more further exchangeable object stations with which said robot is configured to exchange a patterning device.

6. The lithographic apparatus of claim 2, wherein each of said first and second holding device has two gripping devices, each of said gripping devices being configured to hold an exchangeable object, a first of the two gripping devices of each holding device being compatible with said loading station and a second of the two gripping devices of each holding device being compatible with said support.

7. The lithographic apparatus of claim 6, wherein a gripping device is movable between a gripping position and a non-gripping position, whereby said gripping device in said non-gripping position does not interfere with said support or said loading station when an exchangeable object is placed on or taken from said support or said loading station with another gripping device.

8. The lithographic apparatus of claim 1, wherein said robot is configured to, when said robot positions a first of said first and second holding devices to place an exchangeable object on or take an exchangeable object from said support, position a second of said first and said second holding devices in a non-interfering position, wherein said second of said first and said second holding devices does not interfere with said support.

9. The lithographic apparatus of claim 8, wherein said robot is configured to position the second of said first and said second holding devices in a position which is spaced from a support region, said support region being defined by a support structure of the support.

10. The lithographic apparatus of claim 9, wherein said support region includes a support plane.

11. The lithographic apparatus of claim 1, further comprising one or more exchangeable object stations, said exchangeable object handling apparatus being configured to exchange said exchangeable object with respect to said one or more exchangeable object stations.

12. The lithographic apparatus of claim 1, wherein said exchangeable object is said substrate and said support is said substrate table.

13. The lithographic apparatus of claim 1, wherein said exchangeable object is said pattering device and said support is said patterning device support.

14. A device manufacturing method comprising:
   projecting a patterned beam of radiation onto a substrate placed on a substrate table, and
   exchanging an exchangeable object from a support to a loading station or vice versa using a single robot, said robot comprising a first holding device configured to hold an exchangeable object in a first holding position and a second holding device configured to hold an exchangeable object in a second holding position, said second holding device having a gripping device compatible with said support and not with said loading station.

15. The method of claim 14, wherein said robot is configured to place an exchangeable object in or take an exchangeable object out said loading station by using said first holding device, said first holding device having a gripping device compatible with said loading station and not with said support, and wherein said robot is configured to place an exchangeable object on or take an exchangeable object from said support by using said second holding device.

16. The method of claim 15, wherein during an exchange of an exchangeable object from said support to said loading station or vice versa, said exchangeable object is transferred from said first to said second holding device or vice versa.

17. The method of claim 16, wherein during a transfer of said exchangeable object from said first holding device to said second holding device, said robot is configured to place said exchangeable object temporarily on a stationary intermediate station.

18. The method of claim 15, wherein each of said first and second holding devices has a first gripping device compatible with said loading station and a second gripping device compatible with said support, and wherein during an exchange of an exchangeable object from said support to said loading station or vice versa, said exchangeable object is taken over from a first of said first and said second gripping devices to a second of said first and said second gripping devices or vice versa, said exchangeable object staying in a same holding position.

19. The method of claim 14, wherein, when a first of said first and said second holding devices places an exchangeable object on or takes an exchangeable object from said support, said robot is configured to position a second of said first and said second holding devices in a position wherein said second of said first and said second holding devices does not interfere with said support.

20. The method of claim 19, wherein said robot is configured to position the second of said first and said second holding devices in a position which is spaced from a support region defined by a support structure of the support, said support constructed to support an exchangeable object.

21. The method of claim 20, wherein said support region includes a support plane.

22. The method of claim 20, wherein said robot is configured to position said second of said first and said second holding devices above a horizontal plane in which said first of said first and said second holding devices is held.

23. The method of claim 20, wherein said first and said second holding devices are rotatable about an axis of rotation which is arranged at an angle less than about 90 degrees with respect to a support plane of the support region so that during rotation of said first and said second holding devices, said first and said second holding devices are horizontally and vertically displaced, and wherein, when a first of said first and said second holding devices is brought to said support to place an exchangeable object on or take an exchangeable object from said support, said robot is configured to position said first of said first and said second holding devices in a position which is the closest to said support region.

24. The method of claim 19, wherein each of said first and said second holding devices are independently movable with respect to said robot between an load/unload position and an inactive position, and wherein when said first of said first and said second holding devices is positioned in said load/unload position, and said second of said first and said second holding devices is positioned in said inactive position.

25. The method of claim 24, wherein said first and second holding devices are normally in said load/unload position, and wherein, when an end-effector is moved to bring said first of said first and said second holding devices to said support, a stop stops movement of said second of said first and said second holding devices towards said support bringing said second of said first and said second holding devices in the inactive position.

26. The method of claim 24, wherein each of said first and said second holding devices comprises an actuator configured to independently actuate a movement of said first and second holding devices.

27. The method of claim 14, wherein said exchangeable object is said substrate and said support is said substrate table.

28. The method of claim 14, wherein said exchangeable object is a patterning device configured to pattern a beam of radiation and said support is a patterning device support configured to hold the patterning device.

29. An exchangeable object handling apparatus for use with a loading station for a lithographic apparatus, said handling apparatus comprising a single robot having a first object holder configured to hold an exchangeable object in a first holding position and a second object holder configured to hold an exchangeable object in a second holding position, wherein said first object holder, or said second object holder, or both of said first and second object holders, has two gripping devices, each of said gripping devices configured to hold an exchangeable object, and a first of the two gripping devices is compatible with said loading device and a second of the two gripping devices is compatible with said support.

30. A lithographic apparatus comprising:
   an illumination system configured to condition a radiation beam;
   a patterning device support constructed to support a patterning device, the patterning device placed on the patterning device support being capable of imparting the radiation beam with a pattern in its cross-section to form a patterned radiation beam;
   a substrate table constructed to hold a substrate;
   a projection system configured to project the patterned radiation beam onto a target portion of the substrate, and
   an exchangeable object handling apparatus comprising a single robot configured to exchange an exchangeable object with a support and a loading station, the robot comprising a first holding device configured to hold an exchangeable object in a first holding position and a second holding device configured to hold an exchangeable object in a second holding position;
   the robot configured to, when the robot positions a first of the first and the second holding devices to place an exchangeable object on or take an exchangeable object from the support, position a second of the first and the second holding devices in a non-interfering position, wherein the second of the first and the second holding devices does not interfere with the support, and configured to position the second of the first and the second holding devices in a position which is spaced from a support region, the support region being defined by a support structure of the support;
   wherein the first and second holding devices are rotatable about an axis of rotation arranged at an angle less than about 90 degrees with respect to a plane substantially parallel to the support region.

31. The lithographic apparatus of claim 30, wherein said angle is in a range from about 25 to 65 degrees with respect to said support region.

32. The lithographic apparatus of claim 31, wherein said angle is in a range from about 40 to 50 degrees with respect to said support region.

33. A lithographic apparatus comprising:

an illumination system configured to condition a radiation beam;

a patterning device support constructed to support a patterning device, the patterning device placed on the patterning device support being capable of imparting the radiation beam with a pattern in its cross-section to form a patterned radiation beam;

a substrate table constructed to hold a substrate;

a projection system configured to project the patterned radiation beam onto a target portion of the substrate, and an exchangeable object handling apparatus comprising a single robot configured to exchange an exchangeable object with a support and a loading station, the robot comprising a first holding device configured to hold an exchangeable object in a first holding position and a second holding device configured to hold an exchangeable object in a second holding position;

the robot configured to, when the robot positions a first of the first and the second holding devices to place an exchangeable object on or take an exchangeable object from the support, position a second of the first and the second holding devices in a non-interfering position, wherein the second of the first and the second holding devices does not interfere with the support, and configured to position the second of the first and the second holding devices in a position which is spaced from a support region, the support region being defined by a support structure of the support;

wherein each of the first and the second holding devices is independently movable with respect to the robot in a direction substantially perpendicular to a plane substantially parallel to the support region of the support.

34. The lithographic apparatus of claim 33, wherein said device handling apparatus further comprises a stop that is configured to stop movement of said first or said second holding devices in the direction of a support plane of the support region.

35. The lithographic apparatus of claim 33, wherein each of said first and said second holding devices comprises an actuator configured to independently actuate a movement of said first or second holding device with respect to the robot.

* * * * *